(12) United States Patent
Teshima et al.

(10) Patent No.: US 7,967,575 B2
(45) Date of Patent: Jun. 28, 2011

(54) CENTRIFUGAL FAN

(75) Inventors: Hiroyoshi Teshima, Kyoto (JP);
Kazumi Takeshita, Kyoto (JP); Hideki Nagamatsu, Kyoto (JP); Hideaki Konishi, Kusatsu (JP); Tsukasa Takaoka, Kyoto (JP); Kiyoto Ida, Kyoto (JP)

(73) Assignee: Nidec Corporation, Kyoto (JP)

( * ) Notice: Subject to any disclaimer, the term of this patent is extended or adjusted under 35 U.S.C. 154(b) by 1047 days.

(21) Appl. No.: 11/676,511

(22) Filed: Feb. 20, 2007

(65) Prior Publication Data

US 2007/0194668 A1  Aug. 23, 2007

(30) Foreign Application Priority Data

Feb. 20, 2006  (JP) ................. 2006-042784

(51) Int. Cl.
*F04B 35/04* (2006.01)
*F04D 29/44* (2006.01)

(52) U.S. Cl. ............ 417/354; 417/423.1; 415/206

(58) Field of Classification Search ............ 417/354, 417/423.1; 310/103–105, 114, 80; 415/206, 415/213.1
See application file for complete search history.

(56) References Cited

U.S. PATENT DOCUMENTS

| | | | |
|---|---|---|---|
| 5,701,045 A | 12/1997 | Yokozawa et al. | |
| 7,063,510 B2 * | 6/2006 | Takeshita et al. | 416/210 R |
| 7,248,473 B2 * | 7/2007 | Ohnishi et al. | 361/695 |
| 2001/0036416 A1 * | 11/2001 | Obara | 417/423.1 |
| 2002/0057022 A1 | 5/2002 | Yamamoto | |
| 2004/0123978 A1 | 7/2004 | Hashimoto et al. | |
| 2005/0058543 A1 * | 3/2005 | Takeshita et al. | 415/206 |
| 2007/0020085 A1 * | 1/2007 | Takemoto | 415/93 |

FOREIGN PATENT DOCUMENTS

| | | |
|---|---|---|
| DE | 20106595 U1 | 10/2001 |
| JP | S62-115772 U | 7/1987 |
| JP | H07-111756 A | 4/1995 |
| JP | 2001-241395 A | 9/2001 |
| JP | 2002-291194 A | 10/2002 |

* cited by examiner

*Primary Examiner* — Charles G Freay
(74) *Attorney, Agent, or Firm* — Westerman, Hattori, Daniels & Adrian, LLP

(57) ABSTRACT

An arrangement of a low air inlet and a circuit for driving a torque generator in an ultra-compact centrifugal fan is disclosed. In the ultra-compact centrifugal fan, a region occupied by the circuit is not completely arranged radially inside a cup-shaped portion to which an impeller is attached. At least a part of the low air inlet provided on a bottom of a housing of the centrifugal fan is arranged in a range of predetermined angle in an imaginary ring-shaped portion surrounding a base portion covered by the cup-shaped portion. A part of the circuit, that is not covered by the cup-shaped portion, is arranged upstream of the range of the predetermined angle in a flowing direction of airflow.

16 Claims, 19 Drawing Sheets

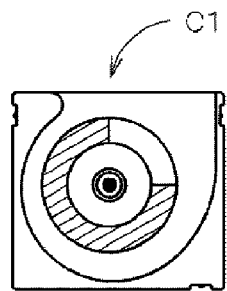
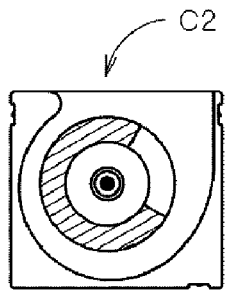
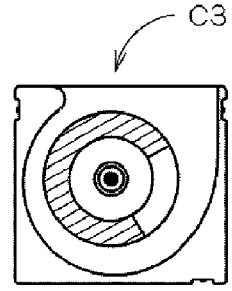
FIG. 12A     FIG. 12B     FIG. 12C
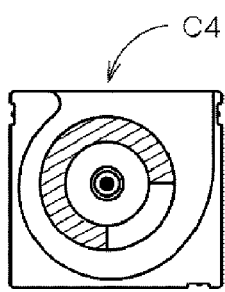
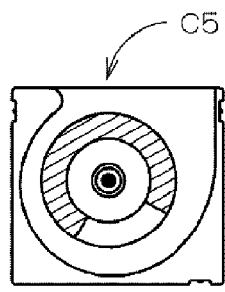
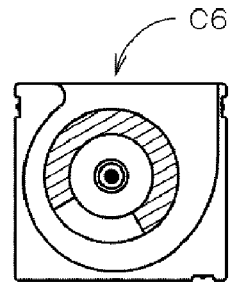
FIG. 12D     FIG. 12E     FIG. 12F

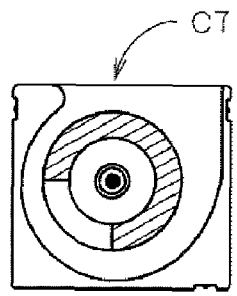 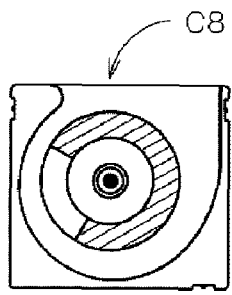 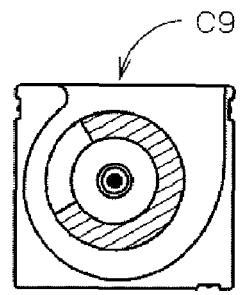
*FIG. 12G*     *FIG. 12H*     *FIG. 12I*
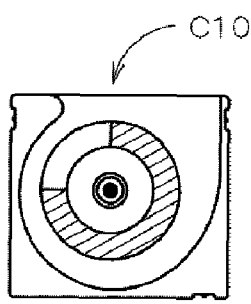 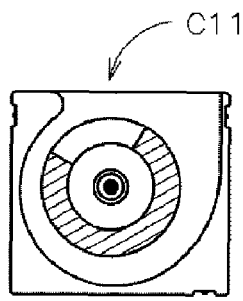 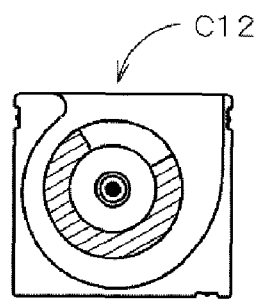
*FIG. 12J*     *FIG. 12K*     *FIG. 12L*

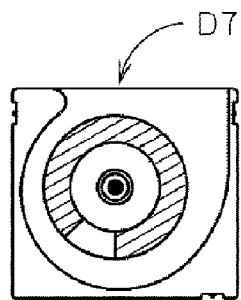
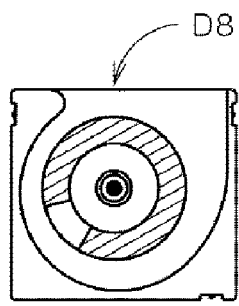
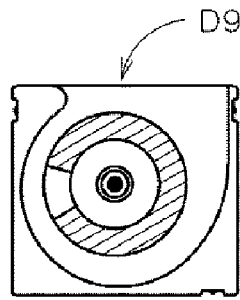
*FIG. 13G*   *FIG. 13H*   *FIG. 13I*
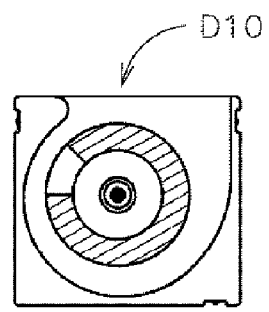
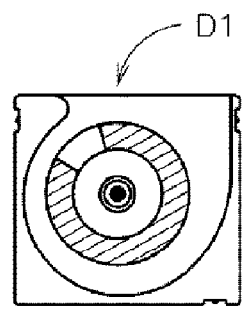
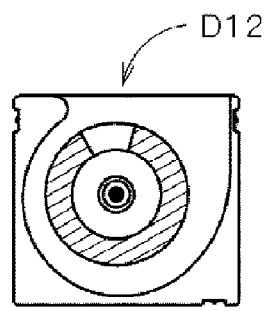
*FIG. 13J*   *FIG. 13K*   *FIG. 13L*

CENTRIFUGAL FAN

BACKGROUND OF THE INVENTION

1. Technical Field

The present invention relates to a centrifugal fan used for blowing air.

2. Description of the Related Art

There are known centrifugal fans that inhale air in an axial direction parallel to a rotation axis and exhale air in a radial direction perpendicular to the axial direction. The centrifugal fans include an impeller having a plurality of blades circumferentially arranged around the rotation axis and accommodated in a housing.

Japanese Unexamined Patent Publication No. 7-111756 (hereinafter, referred to as JP '756) describes air inlets provided on both sides of the housing in the axial direction of the centrifugal fan (i.e., inhaling air from both sides of the housing). This technique increases a flow rate in the centrifugal fan. In the centrifugal fan of JP '756, a cup-shaped portion having an opening is arranged in the housing to be open downward. A magnet for producing a magnetic field is arranged on an inner side face. An armature is provided inside the magnet. A circuit board for supplying a driving current to the armature is arranged below the opening of the cup-shaped portion. The circuit board is arranged inside an outer periphery of the cup portion in the radial direction. The air inlet facing the opening of the cup-shaped portion is formed at a position that is opposed to the blades of the impeller and is therefore radially outside the circuit board.

Japanese Unexamined Patent Publication No. 2002-291194 (hereinafter, referred to as JP '194) discloses a centrifugal fan in which a part of a stator of a motor is formed by the circuit board. The air intake is provided through the circuit board, thereby allowing inhaling of air from a stator-side of the centrifugal fan.

Japanese Unexamined Patent Publication No. 2001-241395 and Japanese Unexamined Utility-Model Publication No. 62-115772 (hereinafter, referred to as JP '395 and JP '772, respectively) disclose a centrifugal fan in which electronic parts for driving the centrifugal fan and the circuit board are arranged radially outside the blades of the impeller.

In recent years, demands for size reduction of centrifugal fans used in electronic devices have increased with size reduction of the electronic devices. There is, however, a technical limitation on size reduction of electronic parts to be mounted on the circuit board. That is, even if the size of the cup-shaped portion is reduced, it is difficult to make the circuit board smaller than an outer profile of the cup-shaped portion, which approximately corresponds to an area of the opening of the cup-shaped portion, when the circuit board and the cup-shaped portion are seen in the axial direction. Therefore, it is difficult to arrange the entire circuit board radially inside the cup-shaped portion so as not to interfere with the air inlet opposed to the blades of the impeller as proposed in JP '756.

In order to prevent interference of the circuit board with the air inlet, the circuit board may be arranged radially outside the blades of the impeller as disclosed in JP '395 and JP '772. In this case, however, the size of the impeller has to be largely reduced in order to ensure a space for the circuit board radially outside of the blades. This causes various problems, for example, degradation of the air-blowing performance of the centrifugal fan, a cumbersome and complicated work for electrically connecting the reduced-sized armature to the circuit board (it is hard to electrically connect the armature to the circuit board in a case where the armature is too small), and increase in likelihood of occurrence of disconnection between the armature and the circuit board.

Moreover, the circuit board may form a part of the stator of the motor in the housing as disclosed in JP '194. In this case, however, disconnection can easily occur, because an external force directly acts on the circuit board when the fan is carried or attached to an electronic device. Furthermore, when electronic parts on the circuit board are arranged within the housing, an airflow generated in the housing is disturbed by the electronic parts, thus causing noises.

BRIEF SUMMARY OF THE INVENTION

According to preferred embodiments of the present invention, a centrifugal fan having the following structure is provided. A shaft of the centrifugal fan is rotatable around a rotation axis. A cup-shaped portion is open downward and attached to the shaft. A plurality of blades are arranged outside the cup-shaped portion in a radial direction perpendicular to the rotation axis, and rotate together with the shaft and generating an airflow. A magnet and an armature, both arranged within an opening of the cup-shaped portion, generates a torque for rotating the shaft, the cup-shaped portion, and the blades. A housing, having top and bottom faces axially opposed to each other and a side face, accommodates the shaft, the cut-shaped portion, the blades, the torque generating means, and the circuit board. The bottom face of the housing has an air inlet for taking an air into the housing. The side face of the housing has an air outlet for discharging the air. The bottom face includes a base portion opposed to the cup-shaped portion in an axial direction parallel to the rotation axis, and also includes a ring-shaped region surrounding the base portion and opposed to the blades. The housing defines a path of the airflow in such a manner that the air outlet is arranged at a downstream end of the path. A circuit for supplying an electrical power to the armature is located on the bottom face of the housing. A portion of the bottom face of the housing with the circuit located thereon includes a first part located in the base portion of the bottom face and a second part located in the ring-shaped region. At least a part of the air inlet is located in a range of a predetermined angle in the ring-shaped region. The second part of the portion with the circuit formed thereon is located upstream of the range of the predetermined angle in a flowing direction of the airflow.

BRIEF DESCRIPTION OF THE SEVERAL VIEWS OF THE DRAWINGS

The above and further features will be more clearly appreciated from the following detailed description when taken in conjunction with the accompanying drawings. In the drawings, like reference numerals indicate like structures. All of these conventions, however, are intended to be typical or illustrative, rather than limiting.

FIGS. 12A to 12L illustrate housings each having a lower air inlet that is open in a range of 90° in a simplified manner.

FIGS. 13A to 13L illustrate housings each having a lower air inlet that is open in a range of 45° in a simplified manner.

DETAILED DESCRIPTION OF THE INVENTION

Figure 1:
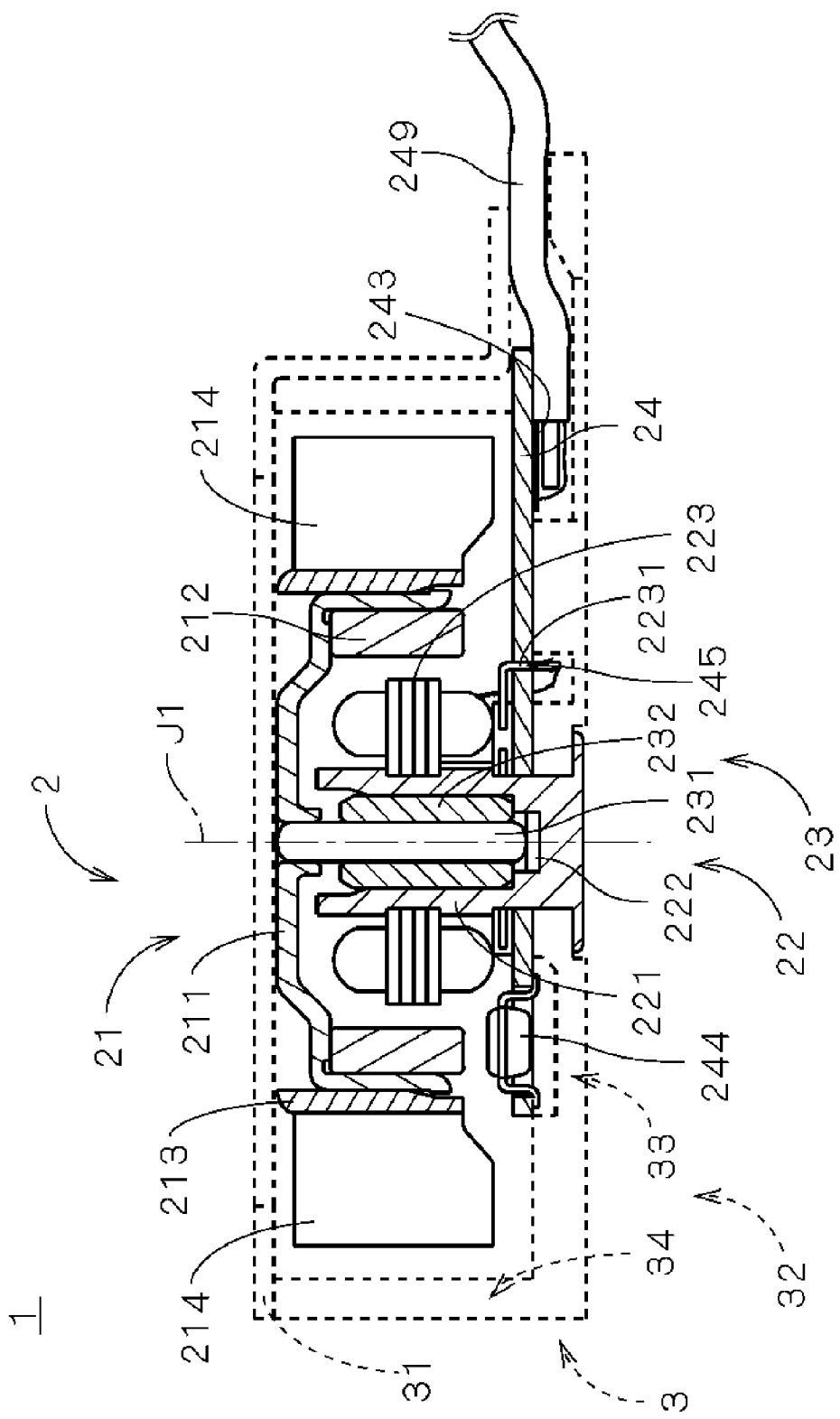
FIG. 1 is a vertical cross-sectional view of a centrifugal fan according to a preferred embodiment of the present invention.

Referring to FIGS. 1 through 16, preferred embodiments of the present invention will be described in detail. It should be noted that in the explanation of the present invention, when positional relationships among and orientations of the different components are described as being up/down or left/right, ultimate positional relationships and orientations that are in the drawings are indicated; positional relationships among and orientations of the components once having been assembled into an actual device are not indicated. Meanwhile, in the following description, an axial direction indicates a direction parallel to a rotation axis, and a radial direction indicates a direction perpendicular to the rotation axis.

Figure 2:
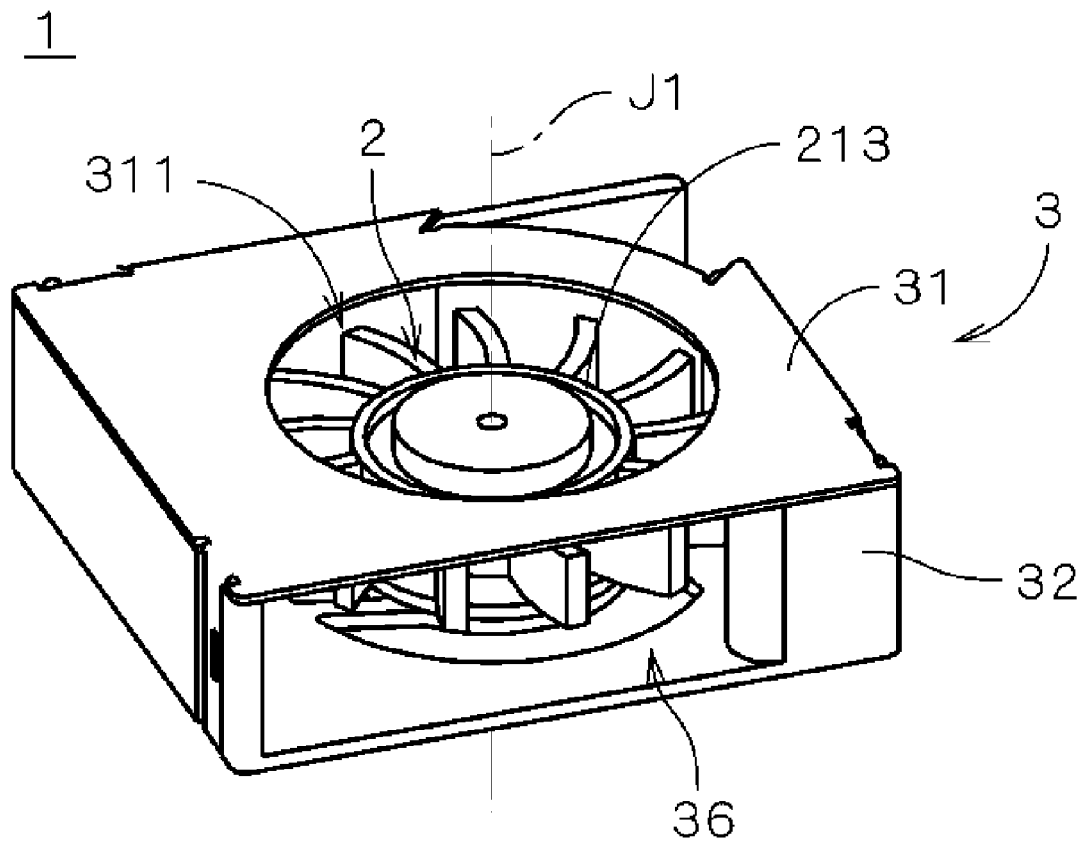
FIG. 2 is a perspective view showing an appearance of the centrifugal fan of FIG. 1.
Figure 3:
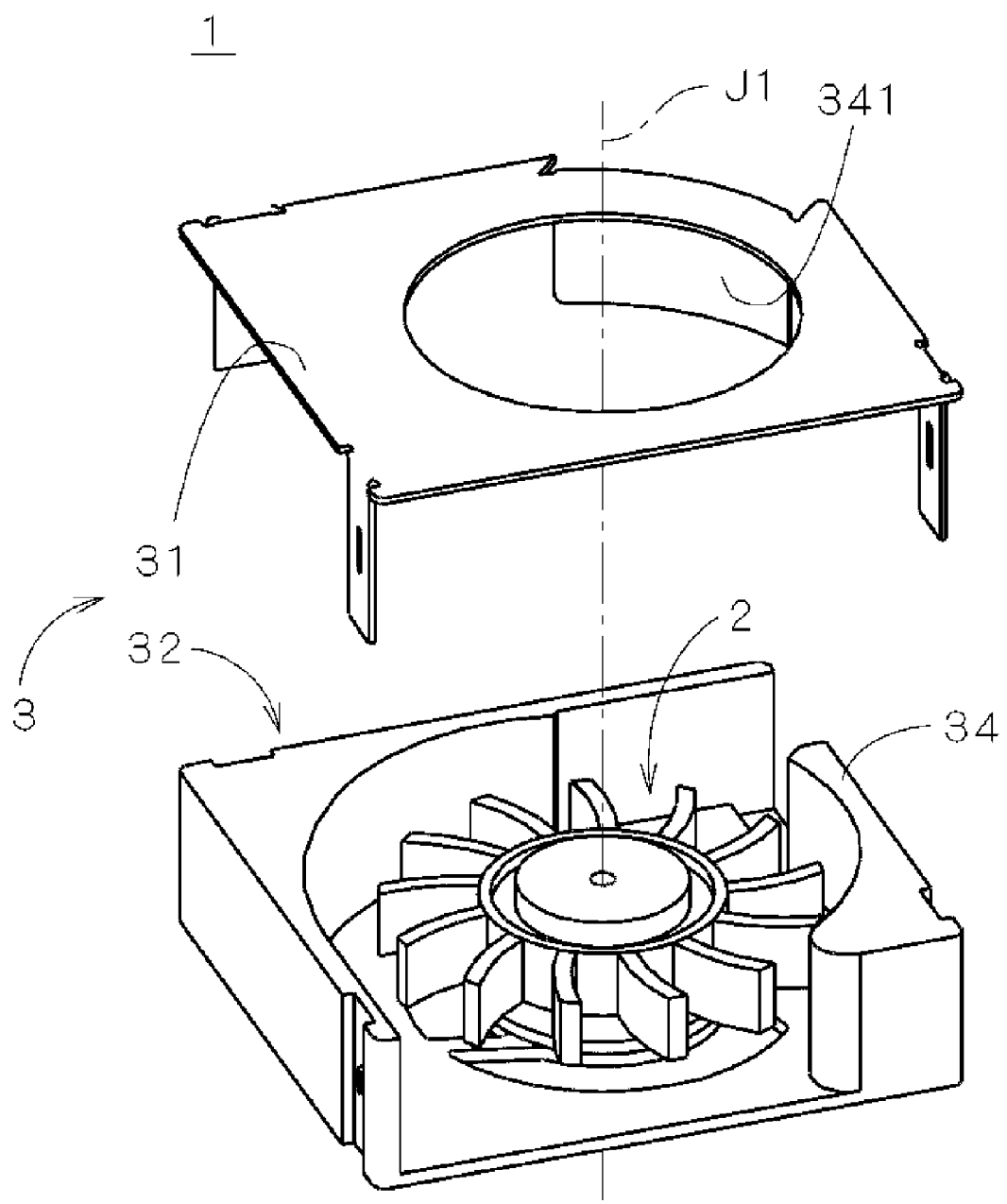
FIG. 3 is a perspective view showing inside of the centrifugal fan of FIG. 1.
Figure 4:
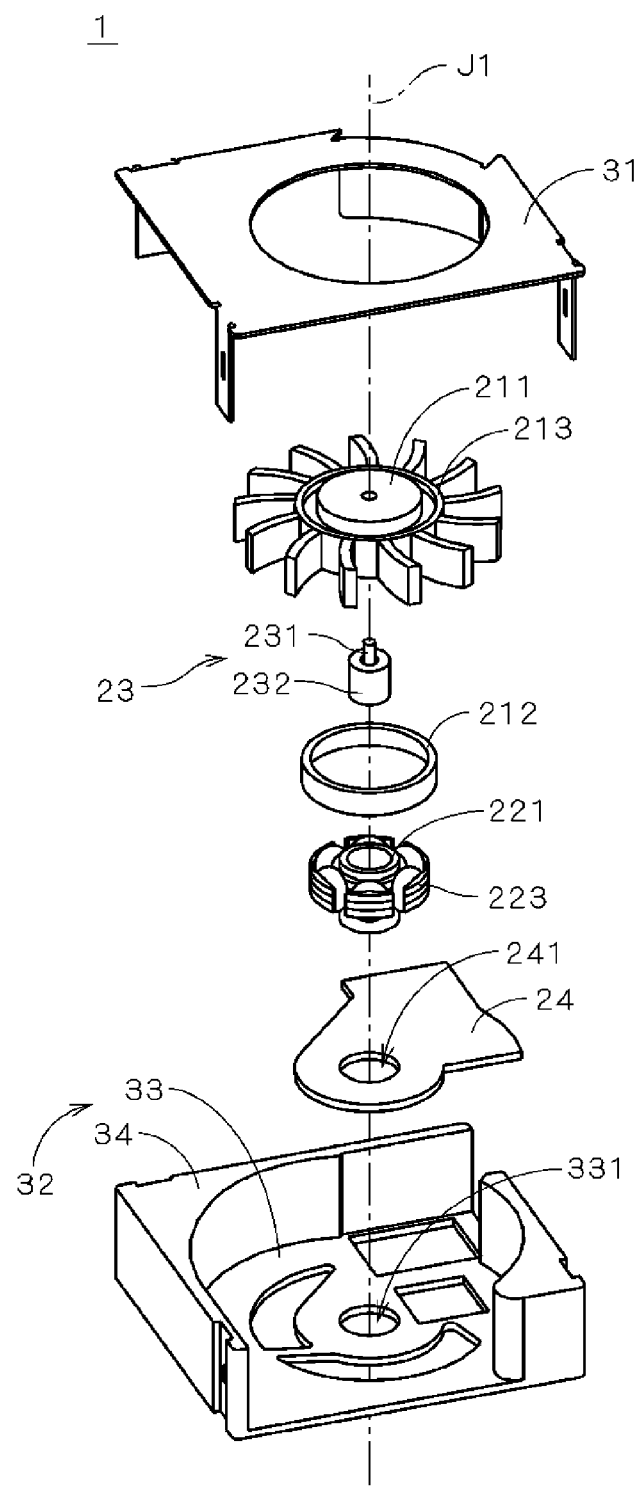
FIG. 4 is an exploded perspective view of a main structure of the centrifugal fan of FIG. 1.

FIG. 1 is a vertical cross-sectional view of a compact centrifugal fan 1 according to a preferred embodiment of the present invention. FIG. 2 is a perspective view showing an appearance of the centrifugal fan 1. FIG. 3 is a perspective view of the centrifugal fan 1 in which only a cover 31 of a housing 3 is removed. FIG. 4 is an exploded perspective view of a main structure of the centrifugal fan 1. In FIGS. 2 to 4, details are omitted for improving visualization.

Referring to FIG. 2, the centrifugal fan 1 includes a motor 2. The motor 2 includes a rotor 21 as a rotating part and a stator 22 as a stationary part. The rotor 21 includes an impeller 213 rotating around a rotation axis J1. The centrifugal fan 1 also includes a housing 3 that accommodating the motor 2. In the shown example, the housing 3 has a shape of an approximately cuboid, but the shape of housing 3 is not limited thereto. The housing 3 includes a side face and upper and lower faces arranged on both sides of the motor 2 in the axial direction. The side face has an opening 36 formed therein. The opening 36 serves as a port through which an airflow exits from the centrifugal fan 1 as described later, and is therefore referred to as an "air outlet 36."

Another opening 311 is provided in the upper face of the housing 3. The upper face is also referred to as a "cover 31" of the housing 3. The cover 31 is opposed to a top of a cup-shaped portion 211 of the motor 2, while the lower face of the housing 3 is opposed to an opening of the cup-shaped portion 211, as described later. The opening 311 serves as an air inlet of the centrifugal fan 1. The cover 31 of the housing 3 is in the form of a plate and can be detached from a housing body 32 including a sidewall 34, as shown in FIG. 3.

Referring to FIG. 1, the rotor 21 is supported by a bearing 23 using a hydrodynamic pressure of oil in a rotatable manner relative to the stator 22. The rotor 21 includes a cup-shaped portion 211 and an impeller 213. The cup-shaped portion 211 is hollow, cylindrical, and open downward. That is, the cup-shaped portion 211 has an opening open downward. The impeller 213 is also substantially cylindrical and hollow and has a center on the rotation axis J1.

An upper face of the cup-shaped portion 211 is opposed to the cover 31 of the housing 3. The cup-shaped portion 211 is open toward the stator 22, i.e., downward in FIG. 1. A diameter of the cup-shaped portion 211 is approximately 10 mm or less (approximately 8 mm in exemplary actual products). The diameter of the cup-shaped portion 211 is set to be approximately 4 mm or more for technical reasons. When the cup-shaped portion 211 is inserted into the hollow of the impeller 213, a plurality of blades 214 of the impeller 213 are annularly arranged radially outside the cup-shaped portion 211 with their center placed on the rotation axis J1.

Referring to FIGS. 1 and 4, a ring-shaped magnet 212 for producing a magnetic field, which is magnetized to achieve a multipole magnet and has a center on the rotation axis J1, is inserted into the cup-shaped portion 211 from below (i.e., from the opening of the cup-shaped portion 211). The inserted ring-shaped magnet 212 is secured to an inner side face of the cup-shaped portion 211. An insertion hole is formed at a center of the upper face of the cup-shaped portion 211 and allows insertion of a shaft 231 of the bearing 23 thereinto. An end to be fixed (i.e., a rotor 21 side end) of the shaft 231 is inserted into that insertion hole, so that the shaft 231 is secured to the cup-shaped portion 211.

A free end of the shaft 231 is inserted into a cylindrical sleeve 232 that is hollow, as shown in FIG. 1. The sleeve 232 is formed of oil-retaining porous metal. The sleeve 232 is inserted into and secured to a cylindrical sleeve holder 221 that is hollow. The sleeve holder 211 has a bottom portion to be attached to a housing body 32 of the housing 3, as described later. Thus, the shaft 231 and the sleeve 232 form the bearing 23 for supporting the cup-shaped portion 211 in a rotatable manner around the rotation axis J1 relative to the housing 3. The specific structure of the bearing 23 is not limited to the above. For example, the bearing 23 may be a ball bearing.

A thrust plate 222 is provided in the bottom portion of the sleeve holder 221 at a position opposed to a free end face of the shaft 231. The thrust plate 222 is formed of synthetic resin having low friction and supports the shaft 231 in the axial direction.

An armature 223 of the stator 22 is arranged around the sleeve holder 221 radially inside the magnetic-field producing magnet 212. Windings of the armature 223 are connected to terminal pins 2231. The terminal pin 2231 is inserted into a hole 245 formed in a circuit board 24 and soldered to an opposite face of the circuit board 24 to the armature 223. With this arrangement, even a small armature 223 can be electrically connected to the circuit board 24 with ease. The circuit board 24 may be a flexible board, e.g., a flexible printed circuit (FPC) board.

The circuit board 24 includes a circuit for supplying electric power to the armature 223. More specifically, at least one electronic part is included in the circuit board 24 and supplies a current to the windings wound around the armature 223. That is, the at least one electronic part forms the circuit for supplying electric power to the armature 223. A current supplied from the circuit board 24 to the armature 223 is controlled, thereby generating a torque (rotating force) around the rotation axis J1 between the magnetic-field producing magnet 212 and the armature 223 inside the magnet 212 (i.e., arranged on the rotation axis side of the magnetic-field producing magnet 212). That is, the magnetic-field producing magnet 212 and the armature 223 form a mechanism generating a torque. The thus generated torque rotates both the cup-shaped portion 211 and the impeller 213 secured thereto in a predetermined rotating direction.

Referring to FIG. 4, the housing body 32 has a bottom 33 in the form of a plate perpendicular to the rotation axis J1 (see FIG. 1). The bottom 33 forms the lower face of the housing 3 in the axial direction. The circuit board 24 is secured to an upper surface (cover-side surface) of the bottom 33. Securing holes 331 and 241 centering on the rotation axis J1 are formed in the bottom 33 and the circuit board 24, respectively. A lower end, i.e., the bottom portion of the sleeve holder 221 is put in the securing holes 331 and 241, so that the sleeve holder 221 is secured to the housing body 32. Please note that the sleeve holder 221 is inserted into the securing holes 331 and 241 from below of the bottom 33 before attachment of the armature 223 to the sleeve holder 221 during manufacturing.

Figure 5:
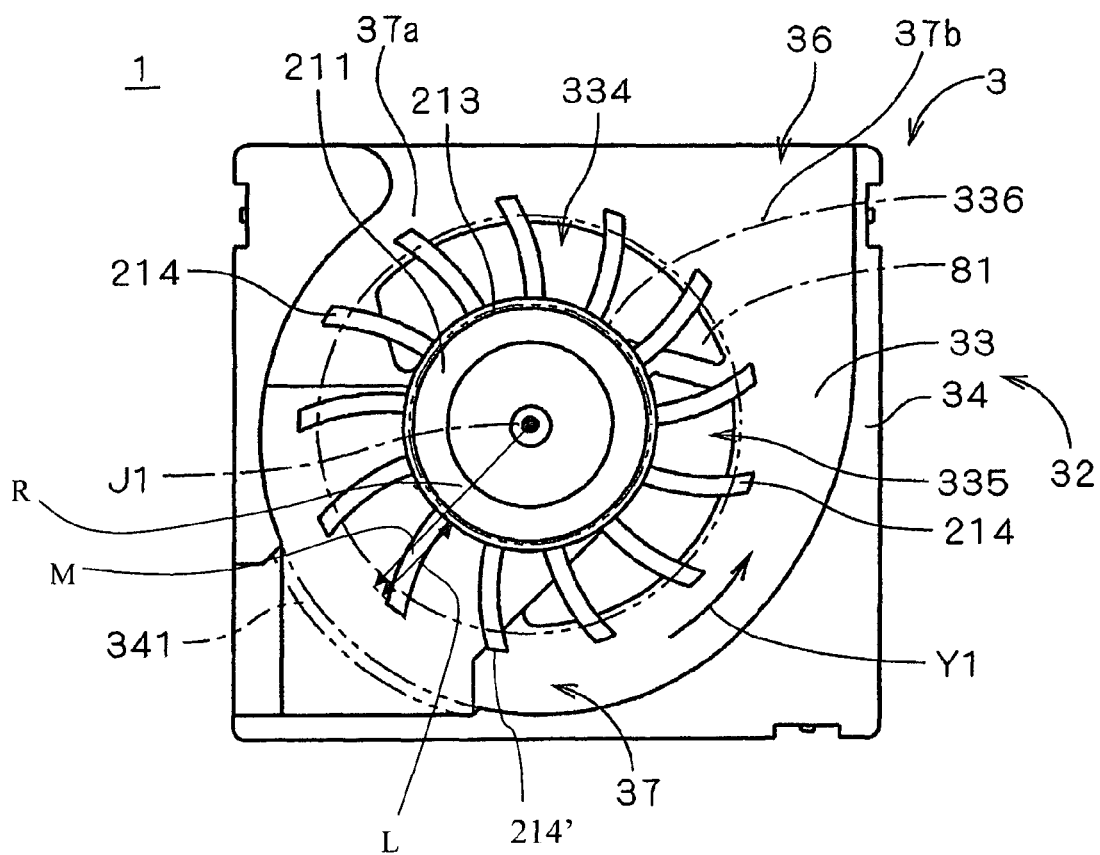
FIG. 5 is a plan view showing the inside of the centrifugal fan of FIG. 1.
Figure 6:
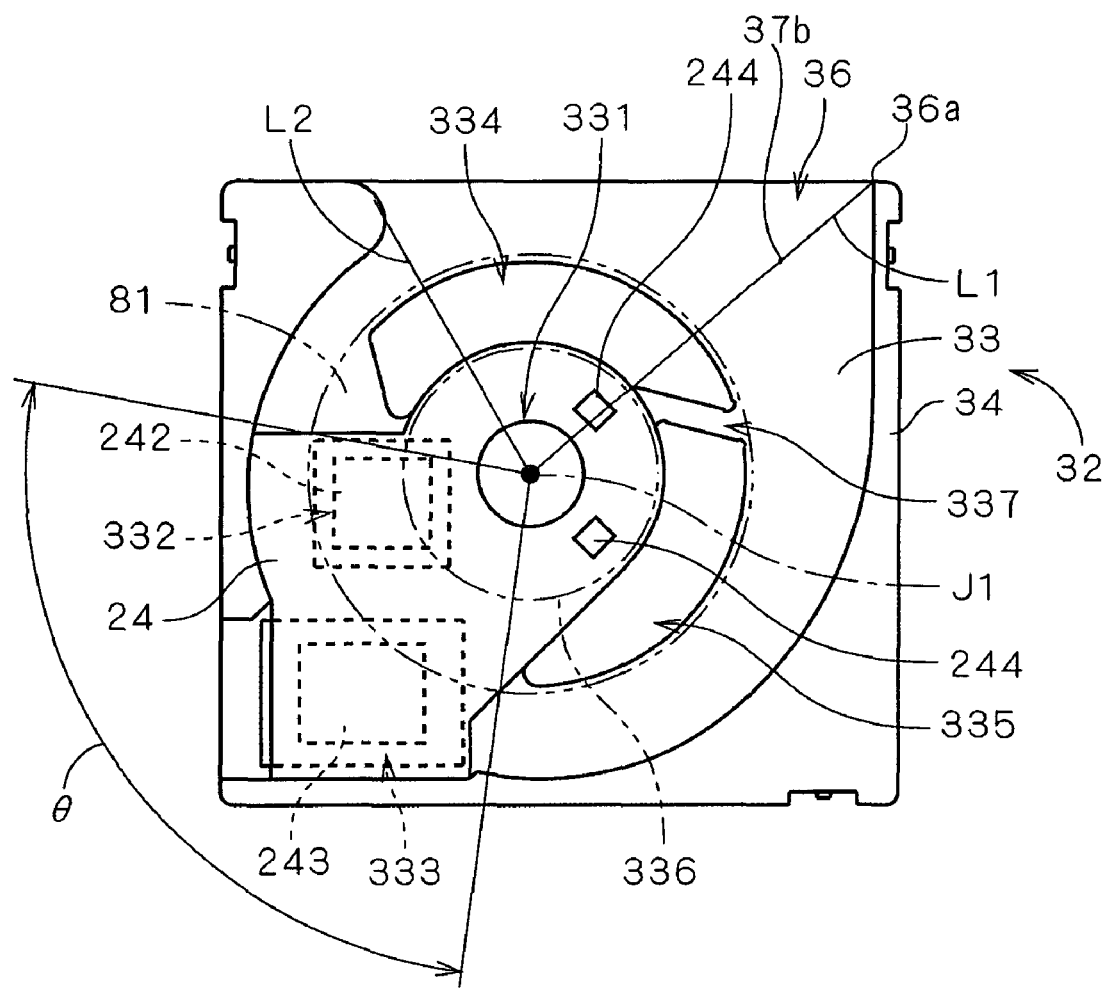
FIG. 6 is a plan view of a circuit board and a housing body of FIG. 1.

FIG. 5 is a plan view of the centrifugal fan 1 in which the cover 31 of the housing 3 is detached. FIG. 6 is a plan view of the circuit board 24 and the housing body 32 only.

An outer shape of the bottom 33 of the housing body 32 is an approximately square in this preferred embodiment. Referring to FIG. 6, the bottom 33 has two holes 332 and 333 formed therein at positions where the circuit board 24 is to be located. In one hole 332, an electronic part 242 mounted on a lower surface (i.e., a surface opposed to the bottom 33 of the housing 3) of the circuit board 24 is arranged. The other hole 333 is formed for ensuring a space for connecting an end of a wire 249 to a terminal 243 formed on the lower face of the circuit board 24 (see FIG. 1). In addition, at least one hole element 244 for detecting a rotation speed of the motor 2 is provided on the upper face of the circuit board 24 at a position opposed to the magnetic-field producing magnet 212 (see FIG. 1).

Referring to FIG. 5, the body sidewall 34 of the housing body 32, which forms a part of the side face of the housing 3, is formed to stand on the bottom 33. The body sidewall 34 partly surrounds an outer circumference of the impeller 213 which corresponds to a path of top ends of the blades 214 during rotation of the impeller 213. The remaining part of the side face of the housing 3 is formed by a cover sidewall 341 as a part of the cover 31 (see FIG. 3). The cover sidewall 341 is shown with dashed two-dotted line in FIG. 5. Thus, the impeller 213 and the cup-shaped portion 211 are accommodated in the housing 3 while being surrounded by the cover 31, the bottom 33, and the side face formed by the body side face 34 and the cover sidewall 341 (see FIG. 3). As described before, the housing 3 includes the air outlet 36 formed in its sidewall. Therefore, an approximately scroll-like passage 37 to the air outlet 36 is defined by inner side faces of the body sidewall 34 and the cover sidewall 341 and the outer circumference of the impeller 213. A width of the passage 37 in a cross section perpendicular to the rotation axis J1 gradually increases toward the air outlet 36.

In the bottom 33 of the housing 3, two holes 334 and 335 in the form of arcs centering on the rotation axis J1 (and having certain diameters in the radial direction R) are formed around a circular portion 336 opposed to the opening of the cup-shaped portion 211 and the impeller 213 (except for the blades 214), as shown in FIG. 5. This circular portion 336 with the bottom 33 is surrounded by an inner circle shown with dashed two-dotted line in FIGS. 5 and 6. Hereinafter, this circular portion 336 is referred to as "a base portion." The through holes 334 and 335 provided in the bottom 33 as well as the opening 311 provided in the cover 31 (see FIG. 2) serve as air inlets of the centrifugal fan 1. In the following description, the through holes 334 and 335 in the bottom 33 are referred to as lower air inlets 334 and 335 and the opening 311 in the cover 31 is referred to as an upper air inlet 311. As described in FIG. 5, each of the blades 214 has a radially outer edge 214', and each of the blades 214 has a middle point M of the length L of the blade in the radial direction R.

Referring to FIG. 6, it is assumed that a line L1 connects the rotation axis J1 to a downstream edge of the side face of the housing 3 in the rotating direction of the impeller 213 on the bottom 33. The downstream edge of the side face of the housing 3 is one end of the air outlet 36 that is the farthest from an upstream end 37a of the passage 37 (see FIG. 5) in the rotating direction of the impeller 213 on the bottom 33. It is also assumed that a line L2 connects the rotation axis J1 to an edge 36a of the side face of the housing 3 closest to the upstream end of the passage 37 on the bottom 33. This edge of the side face is the other end of the air outlet 36. Please note that the rotating direction of the impeller 213 is the same as a flowing direction of airflow generated by rotation of the impeller 213. The downstream end 37b of the passage 37 is illustrated in FIG. 5.

The lower air inlet 334 covers both the lines L1 and L2, and is located near the air outlet 36 in an imaginary ring-shaped region 81 that is substantially opposed to the blades 214 of the impeller 213. The imaging ring-shaped region 81 surrounds the base portion 336 (sandwiched between two circles shown with dashed two-dotted line in FIGS. 5 and 6). A portion 337 in the imaginary ring-shaped region 81 between the lower air inlet 334 and the lower air inlet 335, shown in FIG. 6, is a small rib for fixing the base portion 336 to a portion of the bottom 33 radially outside the imaginary ring-shaped region 81. Thus, a range of ±90° or more around the rotation axis J1 from the line L1 in the imaginary ring-shaped region 81 serves as the lower air inlets 334 and 335 substantially entirely. Moreover, a range of 90° or more around the rotation axis J1 in the imaginary ring-shaped region 81 is covered by the circuit board 24, as shown with an arrow θ in FIG. 6.

As the impeller 213 attached to the cup-shaped portion 211 rotates together with the cup-shaped portion 211 in a counterclockwise direction Y1, air near the centrifugal fan 1 is drawn into the housing 3 via not only the lower air inlets 334 and 335 formed around the base portion 336 on the cup opening side of the housing 3 but also the upper air inlet 311 formed on the opposite side of the housing 3 to the cup-opening side (see FIG. 2). The thus drawn air is moved approximately along the rotating direction of the impeller 213 and away from the rotation axis J1, and then exits from the air outlet 36 after flowing through the passage 37. In this manner, the centrifugal fan 1 blows air by drawing the air in the axial direction and discharging the air in the radial direction.

In the present embodiment, the largest flow rate in the air outlet 36 is obtained near the farthest edge of the air outlet 36 from the upstream end of the passage 37 in the flowing direction of airflow (i.e., near an opposite end of the line L1 to the rotation axis J1 in FIG. 6). The region in which the largest flow rate is obtained is slightly shifted toward the other edge of the air outlet 36, i.e., the edge closest to the upstream end of the passage 37 when design of the air outlet 36 and housing is changed.

Next, results of measurements of the air-blowing performance for various sizes and positions of the lower air inlet in the centrifugal fan 1 are described. Please note that the various lower air inlets described below are not closed by other components.

Figure 7:
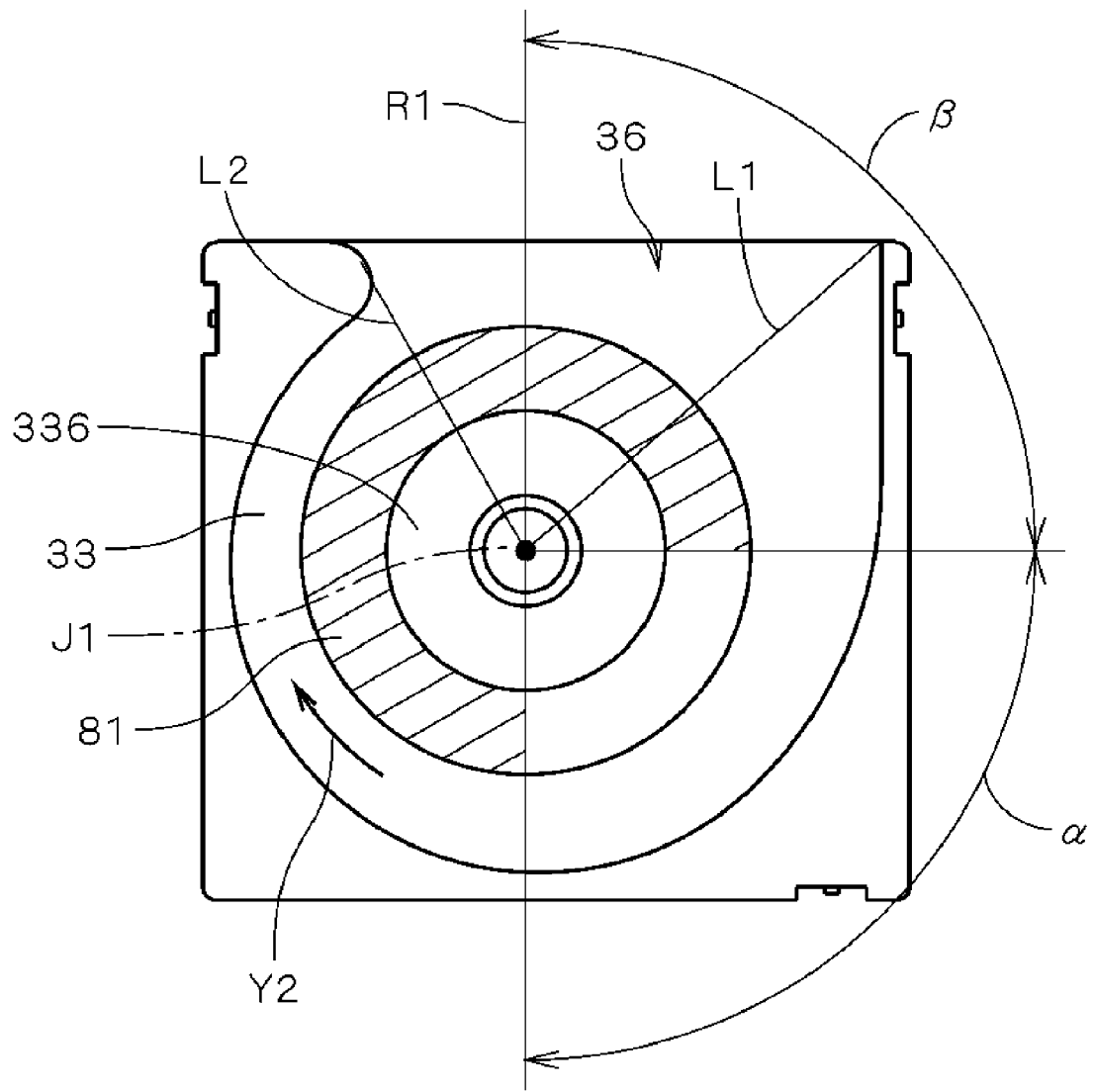
FIG. 7 illustrates a bottom of a housing in a simplified manner.
Figure 8A:
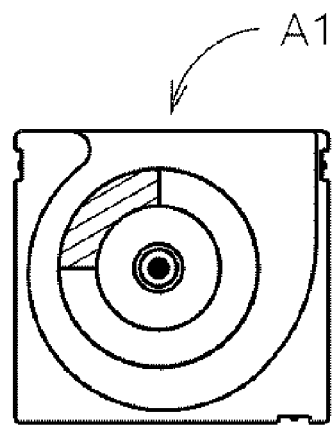
FIGS. 8A to 8D illustrate housings each having a lower air inlet that is open in a range of 270° in a simplified manner.
Figure 8B:
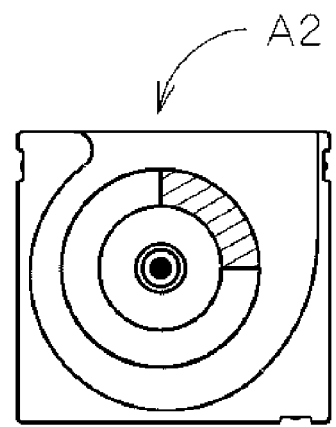
Figure 8C:
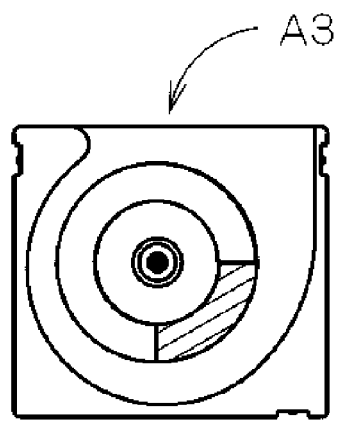
Figure 8D:
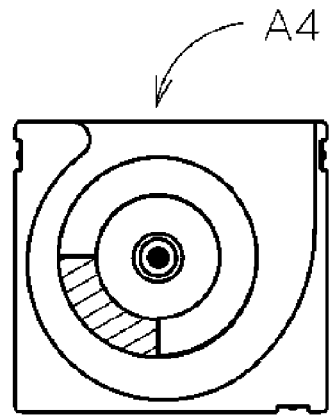
Figure 9A:
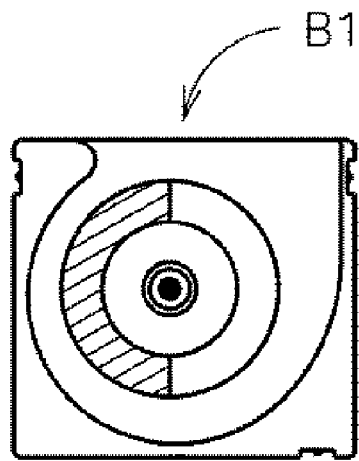
FIGS. 9A to 9D illustrate housings each having a lower air inlet that is open in a range of 180° in a simplified manner.
Figure 9B:
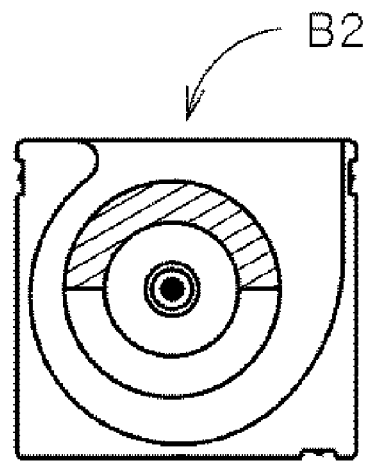
Figure 9C:
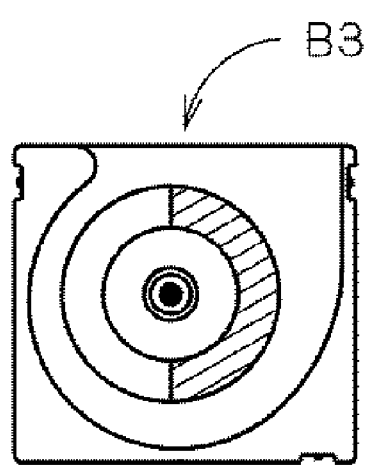
Figure 9D:
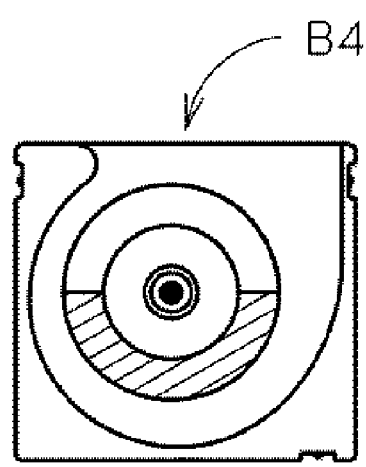

FIG. 7 illustrates the bottom 33 of the housing 3 used in the measurements in a simplified manner. For the measurements, the housing was prepared in which the imaginary ring-shaped region 81 approximately opposed to the blades 214 of the impeller 213 and surrounding the base portion 336 was fully opened. In that housing, the position and size of the lower air inlet were changed by partly closing the imaginary ring-shaped region 81. Please note that there is a rib having a small width and supporting the base portion 336 in the imaginary ring-shaped region 81 in actual housings although that rib is not provided in the housing for measurements. In addition, an outer circumference of the imaginary ring-shaped region 81 was radially inside the path of the top ends of the blades 214 of the impeller 213 in the housing 3 shown in FIG. 5 and the housing used in these measurements (i.e., was slightly closer to the rotation axis J1 than the top ends of the blades 214 of the impeller 213). However, a ring-shaped region in the bottom 33 that is precisely opposed to the blades 214 of the impeller 213 (i.e., a region having an outer circumference coincident with the path of the top ends of the blades 214) may be defined as the imaginary ring-shaped region 81, depending on the shape of the blades 214.

In the measurements, an angle α formed between circumferential ends of the lower air inlet (corresponding to an area of the imaginary ring-shaped region 81 that is not hatched in FIG. 7) was set to 270° and 180° (although an angle α of 90° is shown in FIG. 7 for the sake of convenience). The position of the lower air inlet opened in a range of α was changed, and for that position the air-blowing performance of the centrifugal fan 1 was measured.

In the following description, a position of an imaginary reference line R1, which is the shortest one of lines extending from the rotation axis J1 to the air outlet 36, is defined as the 0° position, angles from the imaginary reference line R1 around the rotation axis J1 in a clockwise direction Y2 (see FIG. 7), which is the counter direction to the rotating direction Y1 of the impeller 213 in FIG. 5, are defined as positive angles, and an angular position β of the lower air inlet is represented by a smaller one of angles of the circumferential ends of the lower air inlet with respect to the imaginary reference line R1. In the measurements, the angular position of the lower air inlet was set to the 0°, 90°, 180°, and 270° positions for each angle α.

FIGS. 8A to 8D are simplified representations of the housings each having the lower air inlet opened in a range of 270° (α=270°). In housings A1, A2, A3, and A4, the 270° lower air inlet was arranged at the 0°, 90°, 180°, and 270° positions, respectively. FIGS. 9A to 9D are simplified representations of the housings each having the lower air inlet opened in a range of 180°. In housings B1, B2, B3, and B4, the 180° lower air inlet was arranged at the 0°, 90°, 180°, and 270° positions, respectively. In a case where the 270° lower air inlet was provided, the remaining range of 90° in the imaginary ring-shaped region 81 was closed. In a case where the 180° lower air inlet was provided, the remaining range of 180° in the imaginary ring-shaped region 81 was closed.

Table 1 shows measurement results of a largest flow rate and a largest static pressure in the centrifugal fan with the 270° lower air inlet. Table 2 shows measurement results of a largest flow rate and a largest static pressure in the centrifugal fan with the 180° lower air inlet. In Tables 1 and 2, the angular position of the lower air inlet is simply referred to as "Angle," and the measurement results obtained when the imaginary ring-shaped region 81 was fully opened and when the imaginary ring-shaped region 81 was fully closed are shown as "Full" and "Close" in the "Angle" field, respectively. The largest flow rate and the largest static pressure are simply referred to as "Flow rate" and "Static pressure," respectively. "ΔQ" represents a difference between the largest flow rate at each angular position (including the "Full" position and the "Close" position) and the largest flow rate when the imaginary ring-shaped region 81 was fully closed ("Close"). "Increase percent (ΔQ)" represents a rate of the flow rate difference at each angular position to the largest flow rate obtained when the imaginary ring-shaped region 81 was fully closed. "ΔPs" represents a difference between the largest static pressure at each angular position and the largest static pressure obtained when the imaginary ring-shaped region 81 was fully closed. "Increase percent (ΔPs)" represents the static pressure difference at each angular position to the largest static pressure obtained when the imaginary ring-shaped region 81 was fully closed (the same is applied to Tables 3 and 4).

TABLE 1

| Angle | Flow rate (Q) | Static Pressure (Ps) | ΔQ | Increase percent (ΔQ) | ΔPs | Increase percent (ΔPs) |
|---|---|---|---|---|---|---|
| Full | 6.48E−03 | 60.74 | 2.09E−03 | 48% | 14.61 | 32% |
| Close | 4.39E−03 | 46.13 | 0.00E+00 | 0% | 0.00 | 0% |
| 0 | 6.21E−03 | 59.82 | 1.82E−03 | 41% | 13.69 | 30% |
| 90 | 5.07E−03 | 53.51 | 6.80E−04 | 15% | 7.38 | 16% |
| 180 | 6.16E−03 | 57.94 | 1.77E−03 | 40% | 11.81 | 26% |
| 270 | 6.42E−03 | 56.87 | 2.03E−03 | 46% | 10.74 | 23% |

TABLE 2

| Angle | Flow rate (Q) | Static Pressure (Ps) | ΔQ | Increase percent (ΔQ) | ΔPs | Increase percent (ΔPs) |
|---|---|---|---|---|---|---|
| Full | 6.48E−03 | 60.74 | 2.09E−03 | 48% | 14.61 | 32% |
| Close | 4.39E−03 | 46.13 | 0.00E+00 | 0% | 0.00 | 0% |
| 0 | 6.09E−03 | 58.92 | 1.70E−03 | 39% | 12.79 | 28% |
| 90 | 4.91E−03 | 55.25 | 5.20E−04 | 12% | 9.12 | 20% |
| 180 | 4.75E−03 | 52.70 | 3.60E−04 | 8% | 6.57 | 14% |
| 270 | 5.93E−03 | 52.78 | 1.54E−03 | 35% | 6.65 | 14% |

As found in Table 1, both differences between the increase percent of flow rate and the increase percent of static pressure obtained when the 270° lower air inlet was arranged at the 0°, 180°, and 270° positions (housings A1, A3, and A4) and those obtained for the lower air inlet fully opened ("Full") was within 10%, which were good. On the other hand, when the housing A2 in which the 270° lower air inlet was arranged at the 90° position, both the differences of the increase percent of flow rate and the increase percent of static pressure from those obtained for the lower air inlet fully opened were much smaller, as compared with those obtained for the housings A1, A3, and A4.

Moreover, in a case of the 180° lower air inlet, the increase percent of flow rate was smaller in the housings B2 and B3 in which the lower air inlet was arranged at the 90° and 180° positions, respectively, than in the housings B1 and B4, as found in Table 2. For the increase percent of static pressure, a value obtained in the housing B1 in which the 180° lower air inlet was arranged at the 0° position was at approximately the same level as that obtained in the housing in which the imaginary ring-shaped region 81 was fully opened.

Figure 10:
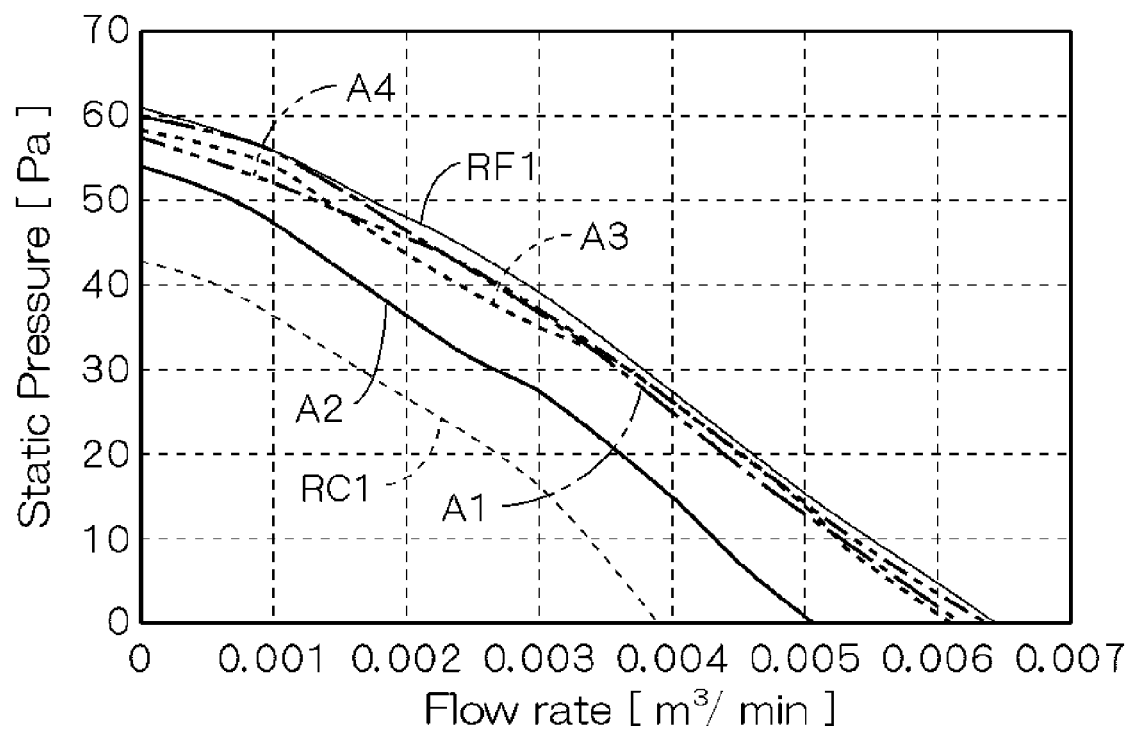
FIG. 10 shows PQ curves of centrifugal fans each having the 270° lower air inlet.
Figure 11:
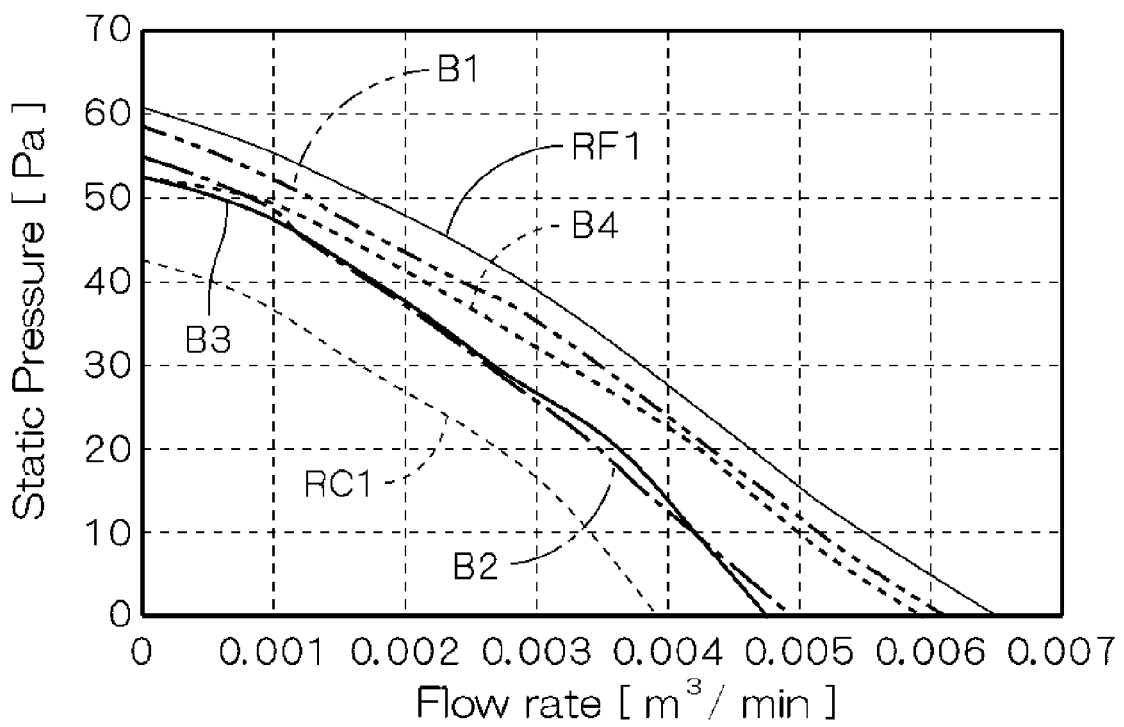
FIG. 11 shows PQ curves of centrifugal fans each having the 180° degree lower air inlet.
Figure 13A:
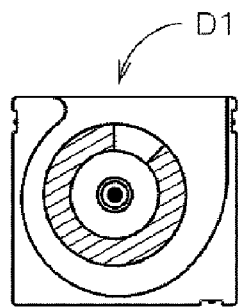
Figure 13B:
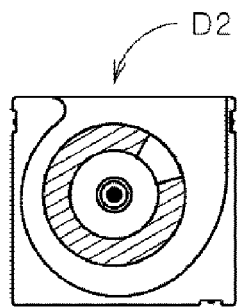
Figure 13C:
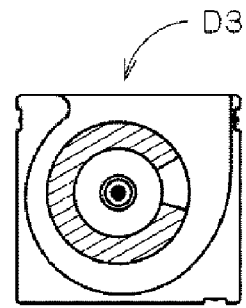
Figure 13D:
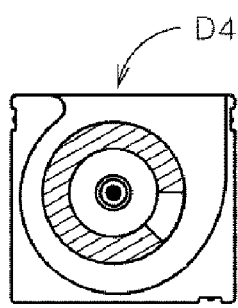
Figure 13E:
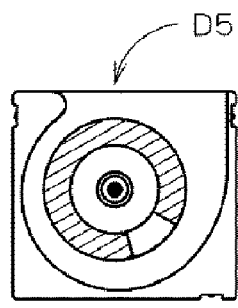
Figure 13F:
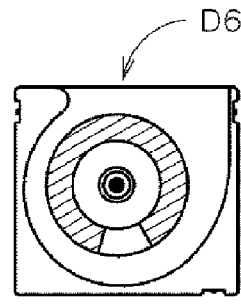

FIG. 10 shows P-Q curves reflecting performances of the centrifugal fans in which the 270° lower air inlet was provided. FIG. 11 shows P-Q curves of the centrifugal fans in which the 180° lower air inlet was provided. The P-Q curves are obtained by measuring flow rates and corresponding static pressures for respective centrifugal fans and show the flow rate on the horizontal axis and the static pressure on the vertical axis. In FIGS. 10 and 11, curves obtained when the lower air inlet was arranged at the 0°, 90°, 180°, and 270° positions are labeled with the same reference signs as those of the corresponding housings in FIGS. 8A to 8D and 9A to 9D, respectively, and curves RF1 and RC1 show the characteristics of the flow rate and the static pressure obtained when the imaginary ring-shaped region 81 was fully opened and closed, respectively.

As found in FIG. 10, the housings A1, A3, and A4 in which the 270° lower air inlet was arranged at the 0°, 180°, and 270° positions, respectively, provided approximately the same flow rate and static pressure characteristics as those obtained when the imaginary ring-shaped region 81 was fully opened, whereas the flow rate and static pressure characteristics were degraded in the housing A2 in which the 270° lower air inlet was arranged at the 90° position (i.e., the static pressure in the housing A2 at a certain flow rate was lower than those measured in the housings A1, A3, and A4). Moreover, as found in FIG. 11, the flow rate and static pressure characteristics were more largely degraded in the housings B2 and B3 in which the 180° lower air inlet was arranged at the 90° and 180° positions, respectively, than in the housings B1 and B4 in which the 180° lower air inlet was arranged at the 0° and 270° positions, respectively.

As described above, the air-blowing performance (i.e., the largest static pressure, the largest flow rate, and the flow rate and static pressure characteristics (P-Q curves)) were largely degraded in a case of using any one of the housing A2 in which the 270° lower air inlet was arranged at the 90° position in the imaginary ring-shaped region 81 and the housings B2 and B3 in which the 180° lower air inlet was arranged at the 90° and 180° positions in the imaginary ring-shaped region 81, respectively. In those housings A2, B2, and B3, a range of 90° in the imaginary ring-shaped region 81 from the imaginary reference line R1 around the rotation axis J1 in the clockwise direction (i.e., opposite direction to the rotating direction) was closed. Since an angle formed between the imaginary reference line R1 and the line L1 (see FIG. 6) connecting the rotation axis J1 to the farthest edge of the air outlet 36 from the upstream end of the passage 37 is approximately 45° in the housing 3 shown in FIG. 7, no air inlet is arranged in a range of ±45° in the imaginary ring-shaped region 81 around the rotation axis J1 from the farthest edge of the air outlet 36 from the upstream end of the passage 37 in the housings A2, B2, and B3. From the above, the range of ±45° in the imaginary ring-shaped region 81 around the rotation axis J1 from the farthest edge of the air outlet 36 from the upstream end of the passage 37 can be regarded as a region largely contributing to drawing of air from the housing-bottom side of the centrifugal fan (hereinafter, this range will be referred to as "highly inhalable region"). The air-blowing performance of the centrifugal fan can be surely improved by arranging the lower air inlet to contain the highly inhalable region.

Moreover, the flow rate in the air outlet 36 is the largest near the farthest edge of the air outlet 36 from the upstream end of the passage 37, as described before. Therefore, it is also possible to surely improve the air-blowing performance of the centrifugal fan by arranging the lower air inlet to contain a range of ±45° around the rotation axis J1 from a position at which the largest flow rate in the air outlet 36 is obtained.

In the centrifugal fan 1 having the housing 3 shown in FIG. 6, a range of 90° or more around the rotation axis J1 in the imaginary ring-shaped region 81 is covered by the circuit board 24. However, a range of ±90° or more around the rotation axis J1 from the farthest edge of the air outlet 36 from the upstream end of the passage 37 in the imaginary ring-shaped region 81 serves as the lower air inlets 334 and 335. Thus, even in a case where the centrifugal fan is ultra-compact, excellent air-blowing performance can be obtained by arranging the lower air inlets 334 and 335 in a preferable range of the imaginary ring-shaped region 81 so as not to be covered by the circuit board 24.

Next, results of other measurements are described. In these measurements, the lower air inlet was opened in a range of 90° and 45° around the rotation axis J1 in the imaginary ring-shaped region 81, and the angular position of the lower air inlet in the imaginary ring-shaped region 81 was changed from 0° to 330° every 30° for each opening angle of the lower air inlet.

FIGS. 12A to 12L are simplified representations of the housings having the 90° lower air inlet. In FIGS. 12A to 12L, the housings in which the 90° lower air inlet was arranged at the 0°, 30°, 60°, . . . , 330° positions are labeled with reference signs C1, C2, C3, . . . , C12, respectively. FIGS. 13A to 13L are simplified representations of the housings having the 45° lower air inlet. In FIGS. 13A to 13L, the housings in which the 45° lower air inlet was arranged at the 0°, 30°, 60°, . . . , and 330° positions are labeled with reference signs D1, D2, D3, . . . , D12, respectively. In the housings with the 90° lower air inlet, a range of 270° in the imaginary ring-shaped region 81 was closed. In the housings with the 45° lower air inlet, a range of 315° in the imaginary ring-shaped region 81 was closed.

Table 3 shows measurement results of a largest flow rate and a largest static pressure of the centrifugal fan having the 90° lower air inlet. Table 4 shows measurement results of a largest flow rate and a largest static pressure of the centrifugal fan having the 45° lower air inlet. A part of the imaginary ring-shaped region 81 shown in FIG. 7 was closed by the rib for supporting the base portion 336, as described before. This rib caused a small variation in the measurement results of the largest flow rate and the largest static pressure in a case where the 45° lower air inlet, i.e., the lower air inlet having a smaller opening, was provided.

TABLE 3

| Angle | Flow rate (Q) | Static Pressure (Ps) | ΔQ | Increase percent (ΔQ) | ΔPs | Increase percent (ΔPs) |
|---|---|---|---|---|---|---|
| Full | 6.45E−03 | 62.37 | 2.14E−03 | 50% | 20.34 | 48% |
| Close | 4.31E−03 | 42.03 | 0.00E+00 | 0% | 0.00 | 0% |
| 0 | 5.61E−03 | 50.13 | 1.31E−03 | 30% | 8.10 | 19% |
| 30 | 5.41E−03 | 49.72 | 1.11E−03 | 26% | 7.69 | 18% |
| 60 | 4.95E−03 | 47.45 | 6.44E−04 | 15% | 5.42 | 13% |
| 90 | 5.14E−03 | 54.57 | 8.31E−04 | 19% | 12.54 | 30% |
| 120 | 5.14E−03 | 56.87 | 8.32E−04 | 19% | 14.84 | 35% |
| 150 | 4.75E−03 | 55.43 | 4.49E−04 | 10% | 13.40 | 32% |
| 180 | 4.90E−03 | 55.65 | 5.94E−04 | 14% | 13.62 | 32% |
| 210 | 4.91E−03 | 52.66 | 6.05E−04 | 14% | 10.63 | 25% |
| 240 | 4.34E−03 | 43.00 | 3.44E−05 | 1% | 0.97 | 2% |
| 270 | 4.58E−03 | 43.29 | 2.79E−04 | 6% | 1.26 | 3% |
| 300 | 5.91E−03 | 52.09 | 1.61E−03 | 37% | 10.06 | 24% |
| 330 | 5.76E−03 | 49.42 | 1.46E−03 | 34% | 7.39 | 18% |

TABLE 4

| Angle | Flow rate (Q) | Static Pressure (Ps) | ΔQ | Increase percent (ΔQ) | ΔPs | Increase percent (ΔPs) |
|---|---|---|---|---|---|---|
| Full | 6.45E−03 | 62.37 | 2.14E−03 | 50% | 20.34 | 48% |
| Close | 4.31E−03 | 42.03 | 0.00E+00 | 0% | 0.00 | 0% |
| 0 | 5.36E−03 | 48.02 | 1.05E−03 | 24% | 5.99 | 14% |
| 30 | 4.71E−03 | 41.35 | 4.09E−04 | 10% | −0.68 | −2% |
| 60 | 4.41E−03 | 45.51 | 1.06E−04 | 2% | 3.48 | 8% |
| 90 | 4.83E−03 | 49.94 | 5.24E−04 | 12% | 7.92 | 19% |
| 120 | 4.44E−03 | 47.13 | 1.34E−04 | 3% | 5.10 | 12% |
| 150 | 4.48E−03 | 48.20 | 1.75E−04 | 4% | 6.17 | 15% |
| 180 | 4.85E−03 | 53.86 | 5.41E−04 | 13% | 11.83 | 28% |
| 210 | 4.40E−03 | 50.12 | 8.99E−05 | 2% | 8.09 | 19% |
| 240 | 4.23E−03 | 44.07 | −7.50E−05 | −2% | 2.04 | 5% |
| 270 | 4.13E−03 | 43.57 | −1.77E−04 | −4% | 1.54 | 4% |
| 300 | 4.06E−03 | 43.51 | −2.49E−04 | −6% | 1.48 | 4% |
| 330 | 4.70E−03 | 45.42 | 3.94E−04 | 9% | 3.39 | 8% |

In the centrifugal fans having the 90° lower air inlet, the increase percent of flow rate and the increase percent of static pressure were extremely small when the 90° lower air inlet was arranged at the 240° and 270° positions (housing C9 and C10), as compared with cases in which the 90° lower air inlet was arranged at other angular positions, as found in Table 3. In the centrifugal fans having the 45° lower air inlet, both the increase percent of flow percent and the increase percent of static pressure were not larger than 5% when the 45° lower air inlet was arranged at the 240°, 270°, and 300° positions (housings D9, D10, and D11), as found in Table 4.

Moreover, in the housings with the lower air inlet containing a region near the 180° position in the imaginary ring-shaped region 81 (i.e., the housings in which the 90° lower air inlet was arranged at any of the 90° to 180° positions and the housings in which the 45° lower air inlet was arranged at any of the 120° to 180° position), the largest static pressure was relatively large. This is because in the housings used in the measurements the width of the annular opening of the lower air inlet in the radial direction was slightly larger at angular positions in a range from 150° to 210° than at other angular positions.

A boundary condition for making both the increase percent of flow rate and the increase percent of static pressure smaller is now discussed in conjunction with the measurement results in Table 4 for the housings having the 45° lower air inlet. When the 45° lower air inlet was arranged at the 210° position (i.e., the imaginary ring-shaped region 81 was opened in a range from 210° to 255°), the increase percent of static pressure was about 20%. When the 45° lower air inlet was arranged at the 330° position (i.e., the imaginary ring-shaped region 81 was opened in a range from 330° to 360° and a range from 0° to 15°), both the increase percent of flow rate and the increase percent of static pressure were about 10%. From those results, an adequate level of air-blowing performance can be obtained by ensuring the lower air inlet opened in a range of at least 45° in a part of the imaginary ring-shaped region 81 other than a range from 255° to 330°. Considering that the line L2 connecting the upstream end of the passage 37 to the rotation axis J1 on the bottom 33 is approximately at the 330° position in the housing 3 shown in FIG. 7, it is important, with regard to obtaining an adequate level of air-blowing performance of the centrifugal fan, to arrange the lower air inlet opened in a range of 45° or more (less than 360°) around the rotation axis J1 in the imaginary ring-shaped region 81 outside a range of 75° around the rotation axis J1 from the upstream end of the passage 37 in the rotating direction of the impeller 213 (this range of 75° will be referred to as "a particular range") or to arrange a range of 45° or more of the lower air inlet to be contained in a part of the imaginary ring-shaped region 81 outside the particular range.

It is also preferable that the lower air inlet cover the line L1 connecting the farthest edge of the air outlet 36 from the upstream end of the passage 37 to the rotation axis J1, considering the experimental results related to the 270° lower air inlet and the 180° lower air inlet (see Tables 1 and 2). It is also preferable that at least a part of the circuit board 24 (more preferably, the whole circuit board 24) cover the aforementioned particular range with regard to efficient use of the imaginary ring-shaped region 81.

Moreover, in a case where the 90° lower air inlet was arranged at the 300° position, both the increase percent of flow rate and the increase percent of static pressure were large, as found in Table 3, although only a part of the lower air inlet was contained in the highly inhalable range of the imaginary ring-shaped region 81. Therefore, even in a case where the circuit board 24 larger than the base portion 336 is secured to the base portion 336 (i.e., at least a part of the circuit board 24 secured to the base portion 36 is located radially outside the base portion 336), an adequate level of air-blowing performance can be obtained in the centrifugal fan by arranging at least a part of the lower air inlet to be contained in the highly inhalable range of ±45° in the imaginary ring-shaped region 81 from the farthest edge of the air outlet 36 from the upstream end of the passage 37 and arranging the circuit board 24 to cover only a part of the imaginary ring-shaped region 81 other than the lower air inlet, or by arranging at least a part of the lower air inlet to be contained in a range of ±45° in the imaginary ring-shaped region 81 from the position at which the largest flow rate in the air outlet 36 is obtained and arranging the circuit board 24 to cover only a part of the imaginary ring-shaped region 81 other than the lower air inlet.

Figure 14:
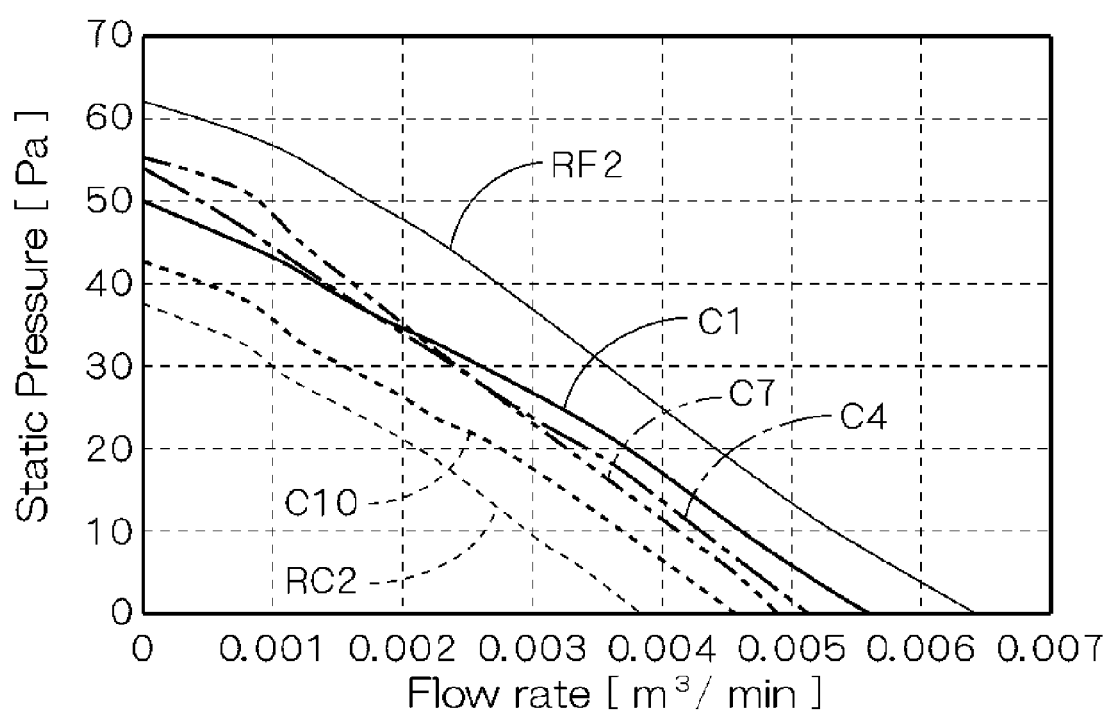
FIG. 14 shows PQ curves of centrifugal fans each having the 90° lower air inlet.
Figure 15:
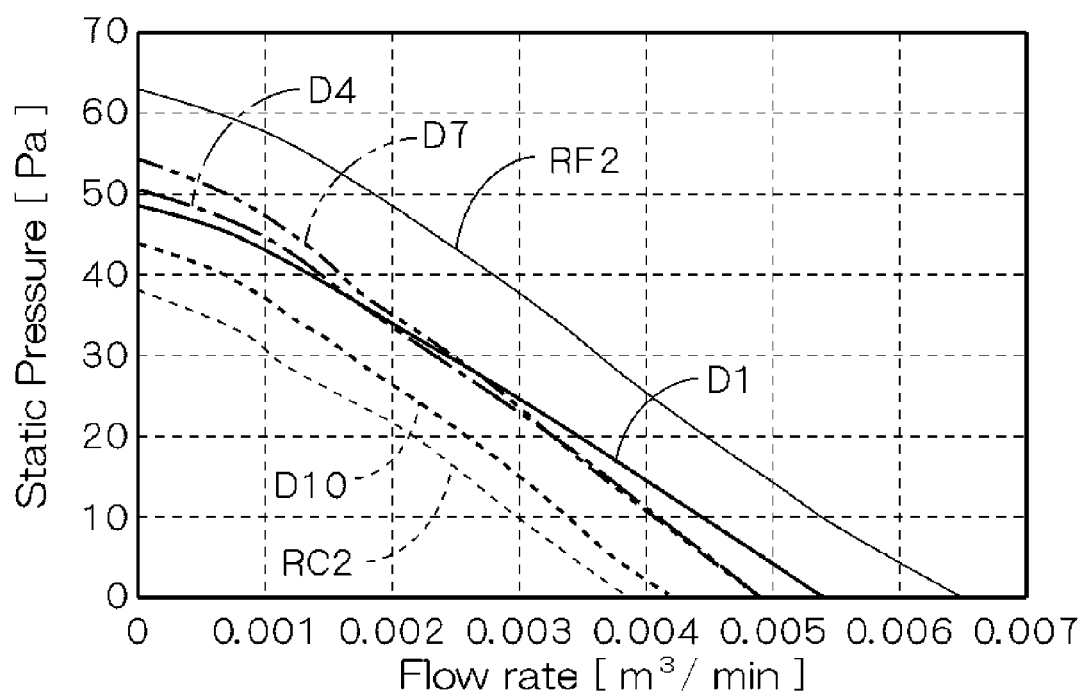
FIG. 15 shows PQ curves of centrifugal fans each having the 45° lower air inlet.
Figure 16:
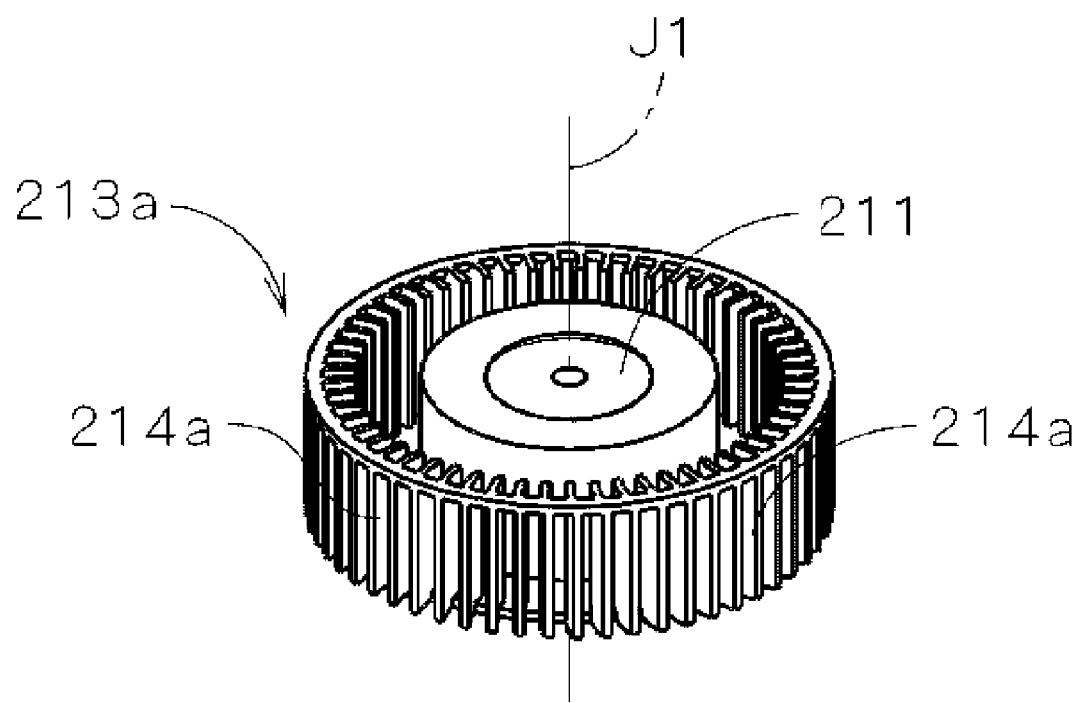
FIG. 16 illustrates an impeller according to another preferred embodiment of the present invention.

FIG. 14 shows P-Q curves of the centrifugal fans with the 90° lower air inlet, and FIG. 15 shows P-Q curves of the centrifugal fans with the 45° lower air inlet. Those P-Q curves were obtained by measuring flow rates and corresponding static pressures for the respective centrifugal fans and show the flow rates on the horizontal axis and the static pressure on the vertical axis. Please note that FIGS. 14 and 15 only show P-Q curves obtained when the lower air inlet was arranged at the 0°, 90°, 180°, and 270° positions. The P-Q curves for those positions are labeled with the same reference signs as those of the corresponding housings shown in FIGS. 12A, 12D, 12G, and 12J and FIGS. 13A, 13D, 13G, and 13G, respectively. Curves RF2 and RC2 were obtained when the imaginary ring-shaped region 81 was fully opened and closed, respectively.

As shown in FIG. 14, both the flow rate and the static pressure in the housing C10 in which the 90° lower air inlet was arranged at the 270° position were lower than those in the housings C1, C4, and C7 in which the 90° lower air inlet was arranged at the 0°, 90°, and 180° positions, respectively. Similarly, in the housing D10 in which the 45° lower air inlet was arranged at the 270° position, both the flow rate and the static pressure were lower than those in the housings D1, D4, and D7 in which the 45° lower air inlet was arranged at the 0°, 90°, and 180° positions, respectively. In other words, FIGS. 14 and 15 show the flow rate and static pressure characteristics were degraded in the housings C10 and D10 in which no opening opened in a range of 45° or more was provided in the imaginary ring-shaped region 81 outside the particular range.

Based on the above measurement results, in the centrifugal fan 1 of the present invention, at least a part of the lower air inlet on the bottom 33 of the housing 3 is arranged in a range of a preferable angle in the imaginary ring-shaped region 81, and a part of the circuit board 24 that is not arranged within the cup-shaped portion 211 in the radial direction is arranged in the imaginary ring-shaped region 81 upstream of the above range of preferable angle. The range of preferable angle is ±45° around the rotation axis J1 from the farthest edge of the air outlet 36 from the upstream end of the path of airflow, or is ±45° around the rotation axis J1 from a position in the air outlet that provides a largest flow rate. Moreover, the range of preferable angle may be outside of a range of 255° to 330° around the rotation axis J1 from the imaginary reference line R1 in the flowing direction of airflow.

The preferred embodiment of the present invention has been described in the above. However, the present invention is not limited to the above. The present invention can be modified in various ways.

In the above embodiment, the circuit for supplying electric power to the armature 223 is formed by the circuit board 24 that is a separate part from the housing 3. However, the circuit may be directly formed on the housing 3. In this case, a portion of the bottom face of the housing 3, on which the circuit is formed, includes a part located in the base portion 336 and a part located in the imaginary ring-shaped region 81 surrounding the base portion 336. The part located in the imaginary ring-shaped region 81 is arranged upstream of the range of the preferable angle (i.e., highly inhalable range) in the ring-shaped region 81 in which at least a part of the lower air outlet 36 is arranged.

The centrifugal fan 1 of the above preferred embodiment includes the impeller 213 having a plurality of blades 214 radially protruding from positions near the outer circumferential surface of the cup-shaped portion 211. Alternatively, the impeller 213 may be replaced with an impeller 213a including: a plurality of blades 214a annularly arranged radially outside the cup-shaped portion 211 with a center placed on the rotation axis J1; and a ring-shaped connection plate that extends outwardly from a lower end (opening end) of the cup-shaped portion 211 and is connected to the blades 214a at its lower end. The air-blowing performance of a centrifugal fan including such an impeller 213a can be also improved by arranging at least a part of the lower air inlet to be contained in the highly inhalable range of the imaginary ring-shaped region surrounding the base portion on the bottom of the housing or by arranging the lower air inlet to contain a range of 45° or more around the rotation axis J1 in the imaginary ring-shaped region other than the particular range. Please note that in this centrifugal fan the outer circumference of the base portion and the inner circumference of the imaginary ring-shaped region are away from each other.

Figure 17:
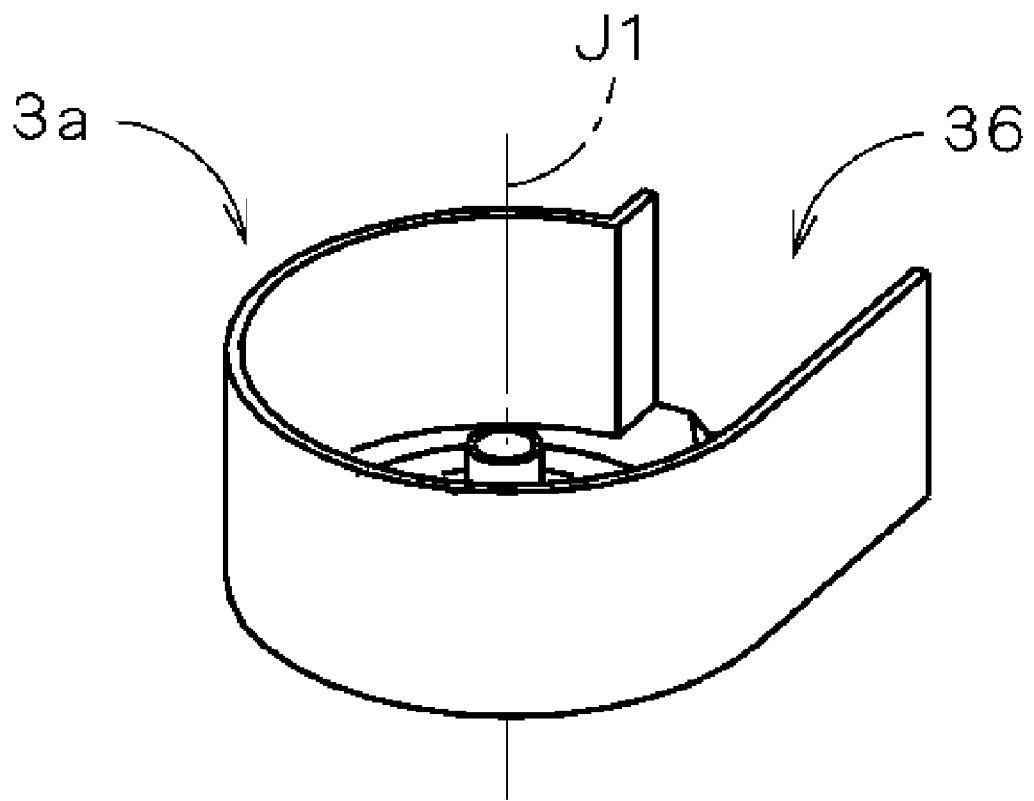
FIG. 17 illustrates a housing according to another preferred embodiment of the present invention.

Moreover, the air outlet 36 may be formed in two continuous side faces of the housing 3 in the centrifugal fan 1. In addition, a housing 3a in which an outer shape of its cross section perpendicular to the rotation axis J1 is approximately circular (or cochlea-like) may be used, as shown in FIG. 17 (a cover of the housing is omitted in FIG. 17). In a centrifugal fan including that housing 3a, it is also possible to improve the air-blowing performance by arranging at least a part of the lower air inlet to be contained in a range of ±45° around the rotation axis J1 from the farthest edge of the air outlet 36 from the upstream end of the passage in the imaginary ring-shaped region surrounding the base portion on the bottom of the housing 3a, or by arranging the lower air inlet to contain a range of 45° or more around the rotation axis J1 in the imaginary ring-shaped region outside a range of 255° to 330° around the rotation axis J1 from the imaginary reference line R1 in the opposite direction to the rotating direction of the impeller 213.

Furthermore, the base portion 336 is opposed to the cup-shaped portion 211 and the impeller 213 (except for the blades 214) in the above embodiment. It is preferable that the base portion 336 be arranged in such a manner an outer circumference of the base portion 336 is substantially coincident with an outer circumference of the impeller 213.

Depending on design, a relationship of size between the base portion 336 and the cup-shaped portion 211 and impeller 213 when seen in the axial direction may be changed. However, the above-described effects of the present invention can be obtained as long as the circuit for supplying electric power to the armature 223 includes a portion that is not covered by the cup-shaped portion 211 and impeller 213.

Although the centrifugal fan 1 of the above preferred embodiment includes the air inlets (the upper air inlet and the lower air inlets) on both sides of the housing 3 in the axial direction, only the lower air inlet may be provided depending on the application of the centrifugal fan 1. The aforementioned method for arranging at least a part of the lower air inlet to be contained in the highly inhalable range of the imaginary ring-shaped region 81 surrounding the base portion 336 of the housing 3 or by arranging the lower air inlet to contain a range of 45° or more around the rotation axis J1 in the imaginary ring-shaped region other than the particular range can be also used in any centrifugal fan that draws air at least in the axial direction. However, in order to further improve the air-blowing performance of such a centrifugal fan, it is preferable to provide the upper air inlet on the opposite side of the housing 3 to the cup opening side, as described in the above embodiment.

In the above preferred embodiment, the diameter of the base portion 336 on the bottom 33 of the housing 3 is approximately 10 mm or less because the diameter of the cup-shaped portion 211 is 10 mm or less. On the other hand, an area for mounting of an electronic part on the circuit board 24 secured on the cup opening side of the housing 3 is usually 2 mm square or more. If the size of the centrifugal fan 1 is reduced to such a size that the diameter of the cup-shaped portion 211 is approximately 6 mm or less, the circuit board 24 including the electronic part inevitably has such a size that a part of the circuit board 24 is located radially outside the cup-shaped portion 211, considering an area for the hole 311 for fixing the sleeve holder 221. However, even in that case, the air-blowing performance of the centrifugal fan can be improved by using the aforementioned method, that is, by arranging at least a part of the lower air inlet in the highly inhalable range of the imaginary ring-shaped region 81 surrounding the base portion 336 or by arranging the lower air inlet to contain a range of 45° or more around the rotation axis J1 in a part of the imaginary ring-shaped region other than the particular range. In either case, the circuit board 24 is arranged upstream of the highly inhalable range (i.e., the range of the preferable angle) in the ring-shaped region 81 in the flowing direction of airflow.

As described above, according to the present invention, the air-blowing performance can be improved in a centrifugal fan that draws air in the axial direction by arranging an air inlet in a preferable range in an imaginary ring-shaped region opposed to a plurality of blades of an impeller on a side of a housing close to an opening of a cup portion and arranging at least a part of a circuit board upstream of the preferable range in the imaginary ring-shaped region in the flowing direction of airflow. In particular, the present invention is advantageous in improvement of the air-blowing performance of an ultra-compact centrifugal fan.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A centrifugal fan comprising:
a shaft rotating around a rotation axis;
a cup-shaped portion opening downward and attached to the shaft;
a plurality of blades provided outside the cup-shaped portion, the blades extending in a radial direction, the blades rotating together with the shaft and generating an airflow, each of the blades has a radially outer edge;
a magnet and an armature both arranged within an opening of the cup-shaped portion and generating a torque for rotating the shaft, the cup-shaped portion, and the blades;
a circuit board supplying an electrical power to the armature,
a housing having top and bottom faces axially opposed to each other and a side face, and accommodating the shaft, the cup-shaped portion, the blades, and the magnet and armature,
wherein the bottom face has a first air inlet for taking an air into the housing, the blades being opposed to a part of the circuit board provided on the bottom face such that the radially outer edge moves across the circuit board,
wherein the side face has an air outlet for discharging the air.

2. The centrifugal fan according to claim 1, wherein a passage is provided between the blades and the side face, the airflow being generated through the passage from an upstream end to a downstream end;
wherein the air outlet has an edge at the downstream end of the passage, a line L1 being provided between the edge and the rotational axis,
wherein the circuit board is provided not to cross the line L1.

3. The centrifugal fan according to claim 2, wherein the bottom face includes a base portion opposed to the cup-shaped portion and an imaginary ring-shaped region surrounding the base portion and opposed to the blades;
wherein the circuit board is placed on the base portion and the imaginary ring-shaped region.

4. The centrifugal fan according to claim 3, wherein at least a part of the first air inlet is located in a range of a predetermined angle in the ring-shaped region; and
wherein the circuit board is located at an upstream side of the range of the predetermined angle in a flowing direction of the airflow in the passage.

5. The centrifugal fan according to claim 4, wherein the range of the predetermined angle is ±45° from the line L1 with respect to the rotation axis.

6. The centrifugal fan according to claim 4, wherein the range of the predetermined angle is outside of a range of 255° to 330° from an imaginary reference line with respect to the rotation axis in a direction opposite to a flowing direction of the airflow, the imaginary reference line being the shortest one of lines connecting the rotation axis to the air outlet.

7. The centrifugal fan according to claim 4, wherein the range of the predetermined angle is ±45° around the rotation axis from a position in the air outlet that provides a largest flow rate.

8. The centrifugal fan according to claim 3, wherein on the circuit board, an electronic part is mounted.

9. The centrifugal fan according to claim 3, wherein:
a diameter of the cup-shaped portion is 10 mm or less; and
the portion of the bottom face with the electric circuit formed thereon has an outer shape which includes a part uncovered with the cup-shaped portion, when seen in an axial direction along the rotation axis.

10. The centrifugal fan according to claim 3, further comprising a second air inlet formed in the top face.

11. The centrifugal fan according to claim 10, wherein the impeller is completely exposed through the second air inlet when the centrifugal fan is seen from an upper side of the rotational axis.

12. A centrifugal fan according to claim 1, further comprising an impeller outside the cup-shaped portion, wherein the blades are arranged outside the impeller.

13. A centrifugal fan according to claim 1, wherein each of the blades has further has a length in the radial direction and a middle point of the length, wherein the middle point moves across the circuit board.

14. A centrifugal fan comprising:
a shaft rotating around a rotation axis;
a cup-shaped portion opening downward and attached to the shaft;
a plurality of blades provided outside the cup-shaped portion, the blades extending in a radial direction, the blades rotating together with the shaft and generating an airflow, each of the blades has a length in the radial direction and a middle point of the length;
a magnet and an armature both arranged within an opening of the cup-shaped portion and generating a torque for rotating the shaft, the cup-shaped portion, and the blades;
a circuit board supplying an electrical power to the armature,
a housing having top and bottom faces axially opposed to each other and a side face, and accommodating the shaft, the cup-shaped portion, the blades, and the magnet and armature,
wherein the bottom face has a first air inlet for taking an air into the housing, the blades being opposed to a part of the circuit board provided on the bottom face such that the middle point moves across the circuit board,
wherein the side face has an air outlet for discharging the air.

15. A centrifugal fan according to claim 14, further comprising an impeller outside the cup-shaped portion, wherein the blades are arranged outside the impeller.

16. A centrifugal fan according to claim 14, wherein each of the blades further has a radially outer edge, wherein the radially outer edge moves across the circuit board.

* * * * *